(12) United States Patent  
Shirai et al.

(10) Patent No.: US 10,485,110 B2  
(45) Date of Patent: Nov. 19, 2019

(54) ELECTRICAL CONNECTION METHOD OF PRINTED CIRCUIT AND ELECTRICAL CONNECTION STRUCTURE OF PRINTED CIRCUIT

(71) Applicant: Yazaki Corporation, Minato-ku, Tokyo (JP)

(72) Inventors: Mizuki Shirai, Susono (JP); Hiroki Kondo, Susono (JP)

(73) Assignee: Yazaki Corporation, Minato-ku, Tokyo (JP)

(*) Notice: Subject to any disclaimer, the term of this patent is extended or adjusted under 35 U.S.C. 154(b) by 0 days.

(21) Appl. No.: 16/040,596

(22) Filed: Jul. 20, 2018

(65) Prior Publication Data

US 2018/0332718 A1  Nov. 15, 2018

Related U.S. Application Data

(62) Division of application No. 15/878,063, filed on Jan. 23, 2018.

(30) Foreign Application Priority Data

Feb. 8, 2017 (JP) .................... 2017-021021

(51) Int. Cl.  
  *H05K 1/00* (2006.01)  
  *H05K 1/02* (2006.01)  
  (Continued)

(52) U.S. Cl.  
  CPC ............ *H05K 3/4038* (2013.01); *H01R 4/04* (2013.01); *H01R 12/52* (2013.01); *H05K 1/092* (2013.01);  
  (Continued)

(58) Field of Classification Search  
  CPC .. H05K 1/00; H05K 1/02; H05K 1/03; H05K 1/11; H05K 1/14; H05K 3/00; H05K 3/06;  
  (Continued)

(56) References Cited

U.S. PATENT DOCUMENTS 5,361,491 A * 11/1994 Oomachi ............. H01L 21/486  
  29/852  
6,172,730 B1 * 1/2001 Fujita ................. G02F 1/13452  
  349/138

(Continued)

FOREIGN PATENT DOCUMENTS

JP  2001313448 A  11/2001  
JP  2016-025329 A  2/2016  
WO  2009113202 A1  9/2009

OTHER PUBLICATIONS

Aug. 2, 2018—U.S. Non-Final Office Action—U.S. Appl. No. 15/878,063.

(Continued)

*Primary Examiner* — Xiaoliang Chen  
(74) *Attorney, Agent, or Firm* — Banner & Witcoff, Ltd.

(57) ABSTRACT

An electrical connection method of a printed circuit includes overlapping a base material and a thin member in which a thin conductor is mounted, forming a through hole which passes through the base material overlapped with the thin member in the overlapping and reaches the thin conductor of the thin member, and forming a printed circuit on the base material by a screen printing method using conductive paste. The through hole formed in the forming of the through hole is filled with the conductive paste in the forming of the printed circuit.

2 Claims, 6 Drawing Sheets

(51) Int. Cl.
- *H05K 1/03* (2006.01)
- *H05K 1/11* (2006.01)
- *H05K 1/14* (2006.01)
- *H05K 3/00* (2006.01)
- *H05K 3/06* (2006.01)
- *H05K 3/10* (2006.01)
- *H05K 3/36* (2006.01)
- *H05K 3/40* (2006.01)
- *H05K 3/42* (2006.01)
- *H05K 3/46* (2006.01)
- *H01R 4/04* (2006.01)
- *H01R 12/52* (2011.01)
- *H05K 1/09* (2006.01)
- *H05K 3/12* (2006.01)

(52) U.S. Cl.
CPC .......... *H05K 1/115* (2013.01); *H05K 3/1216* (2013.01); *H05K 2201/09563* (2013.01)

(58) Field of Classification Search
CPC .. H05K 3/10; H05K 3/36; H05K 3/40; H05K 3/42; H05K 3/46
USPC ....... 174/264, 250, 254, 255, 257, 261, 266, 174/387; 29/829, 830, 846, 849, 852
See application file for complete search history.

(56) References Cited

U.S. PATENT DOCUMENTS

| | | | |
|---|---|---|---|
| 6,407,508 B1* | 6/2002 | Kawada | G02F 1/13452 257/668 |
| 6,809,267 B1* | 10/2004 | Kurita | H05K 3/361 174/254 |
| 8,238,109 B2* | 8/2012 | Sagisaka | H05K 3/4691 174/254 |
| 8,405,999 B2 | 3/2013 | Takahashi | |
| 8,896,761 B2* | 11/2014 | Happoya | H04N 5/64 348/725 |
| 10,051,736 B2* | 8/2018 | Ishihara | H05K 1/0313 |
| 2004/0078970 A1* | 4/2004 | Naitoh | H05K 3/423 29/852 |
| 2005/0179747 A1* | 8/2005 | Iamai | B41J 2/14209 347/71 |
| 2007/0102830 A1 | 5/2007 | Muto et al. | |
| 2007/0194428 A1* | 8/2007 | Sato | H05K 3/363 257/686 |
| 2007/0281505 A1* | 12/2007 | Kobayashi | H05K 3/4691 439/69 |
| 2008/0093118 A1* | 4/2008 | Takahashi | H05K 3/4691 174/264 |
| 2008/0099230 A1* | 5/2008 | Takahashi | H05K 3/4691 174/250 |
| 2008/0289859 A1* | 11/2008 | Mikado | H05K 1/0281 174/254 |
| 2009/0014205 A1* | 1/2009 | Kobayashi | H05K 3/0052 174/255 |
| 2009/0084597 A1* | 4/2009 | Chuma | H05K 1/148 174/261 |
| 2009/0229876 A1* | 9/2009 | Takahashi | H05K 3/4691 174/378 |
| 2010/0014265 A1* | 1/2010 | Sagisaka | H05K 3/4691 361/784 |
| 2010/0055324 A1* | 3/2010 | Ito | B41J 2/2132 427/256 |
| 2010/0099322 A1* | 4/2010 | Katagami | B41J 3/28 445/24 |
| 2010/0147576 A1* | 6/2010 | Hondo | H05K 3/4069 174/266 |
| 2010/0155109 A1* | 6/2010 | Takahashi | H05K 1/028 174/254 |
| 2010/0195967 A1* | 8/2010 | Wang | G02B 6/43 385/129 |
| 2011/0067904 A1* | 3/2011 | Aoyama | H05K 3/4069 174/254 |
| 2011/0094775 A1* | 4/2011 | Lin | H05K 1/118 174/254 |
| 2011/0194262 A1* | 8/2011 | Naganuma | H05K 3/4691 361/749 |
| 2011/0198111 A1* | 8/2011 | Naganuma | H05K 3/4691 174/254 |
| 2011/0283532 A1 | 11/2011 | Takahashi | |
| 2012/0227261 A1* | 9/2012 | Inui | H05K 1/186 29/849 |
| 2013/0277095 A1* | 10/2013 | Lin | H05K 1/0277 174/254 |
| 2014/0146491 A1* | 5/2014 | Chan | H05K 1/189 361/749 |
| 2016/0098111 A1* | 4/2016 | Tsukamoto | G06F 3/044 345/173 |
| 2016/0205781 A1* | 7/2016 | Chan | H05K 1/181 361/749 |
| 2016/0233167 A1* | 8/2016 | Shimizu | H01L 23/5384 |
| 2016/0380370 A1* | 12/2016 | Li | H01R 12/7076 439/78 |
| 2017/0131581 A1* | 5/2017 | Pletenetskyy | G02F 1/1347 |
| 2017/0215282 A1* | 7/2017 | Ishihara | H05K 1/0313 |
| 2017/0354035 A1* | 12/2017 | Inamori | H05K 1/147 |
| 2018/0178509 A1 | 6/2018 | Chino | |

OTHER PUBLICATIONS

Nov. 29, 2018—U.S. Final Office Action—U.S. Appl. No. 15/878,063.
Apr. 19, 2019—U.S. Non-Final Office Action—U.S. Appl. No. 15/878,063.

* cited by examiner

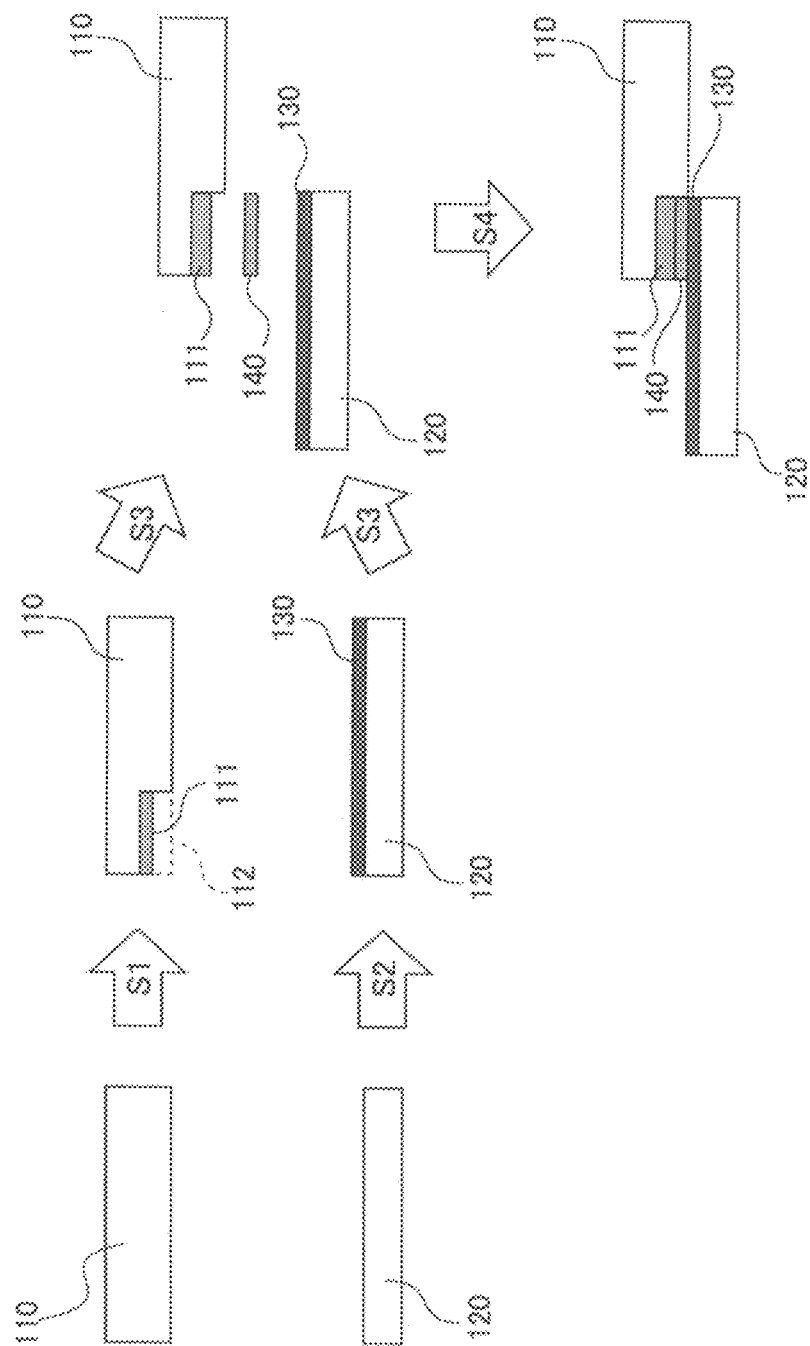

ELECTRICAL CONNECTION METHOD OF PRINTED CIRCUIT AND ELECTRICAL CONNECTION STRUCTURE OF PRINTED CIRCUIT

CROSS REFERENCE TO RELATED APPLICATIONS

This application is a divisional of co-pending U.S. application Ser. No. 15/878,063, filed Jan. 23, 2018, which claims priority from Japanese Patent Application No. 2017-021021 filed on Feb. 8, 2017, the entire contents of which are incorporated herein by reference.

BACKGROUND OF THE INVENTION

Field of the Invention

The present invention relates to an electrical connection method of a printed circuit and an electrical connection structure of the printed circuit.

Description of Related Art

In the related art, a printed wiring board is proposed in which a through hole is formed in an insulating base material, the through hole is filled with conductive paste to form a via, and a circuit is formed to be overlapped with the via on both surfaces of the insulating base material (see, for example, JP-A-2016-25329).
[Patent Document 1] JP-A-2016-25329

According to a related art, there is an electrical connection between a printed circuit which is printed on a base material and a thin conductor which is mounted in a thin member such as an FPC (Flexible Printed Circuit) and an FFC (Flexible Flat Cable).

For example, in a case where the printed circuit and the thin conductor of the FFC are electrically connected, first the printed circuit is formed in the base material, a coated portion of the FFC is peeled off to expose the thin conductor, and then the printed circuit printed on the base material and the exposed conductive portion of the FFC are bonded by a conductive adhesive and cured. Therefore, there are necessary the procedures of the forming of the printed circuit, the peeling, the applying of the conductive adhesive, and the curing. For this reason, it cannot be said that manufacturability is good. In particular, in a case where circuits to be connected are disposed at a narrow pitch, the adjacent circuits come to be short-circuited if an anisotropic conductive adhesive is not used. Therefore, there is desired an electrical connection method which is simpler and reduces a possibility of a short circuit.

SUMMARY

One or more embodiments provide an electrical connection method of a printed circuit and an electrical connection structure of the printed circuit which is simpler and is able to reduce a possibility of a short circuit.

In accordance with one or more embodiments, an electrical connection method of a printed circuit, includes overlapping a base material and a thin member in which a thin conductor is mounted, forming a through hole which passes through the base material overlapped with the thin member in the overlapping and reaches the thin conductor of the thin member, and forming the printed circuit on the base material by a screen printing method using conductive paste. The through hole formed in the forming of the through hole is filled with the conductive paste in the forming of the printed circuit.

According to one or more embodiments, a through hole is filled with a conductive paste when a printed circuit is formed on a base material. Therefore, it is possible to perform an electrical connection using at least the forming of the printed circuit, resulting in simplification of the manufacturing procedure. Further, since the conductive adhesive is not applied on the printed circuit formed on the base material, a short circuit occurring between the printed circuit and the adjacent thin conductor due to flowing out of the conductive adhesive is also prevented. Therefore, it is possible to provide the electrical connection method of the printed circuit which is simpler and reduces a possibility of the short circuit.

In the electrical connection method of the printed circuit of one or more embodiments, the thin member in the overlapping may be a flat shield cable covered with a shield member except one portion of the thin member. In the forming of the through hole, a first through hole may be formed to pass through the base material overlapped in the overlapping and to open the one portion of the thin member so as to reach the thin conductor, a second through hole may be formed to pass through the base material overlapped in the overlapping to reach the shield member. In the forming of the printed circuit, the first through hole may be filled with the conductive paste when a signal line is formed as a first printed circuit on the base material, and the second through hole is filled with the conductive paste when a ground line is formed as a second printed circuit on the base material at the same time as the signal line is formed.

According to one or more embodiments, a first through hole reaching a thin conductor is filled with the conductive paste when a signal line is formed, and a second through hole which passes through the base material and reaches a shield member is filled with the conductive paste when a ground line is formed at the same time as the signal line is formed. Therefore, a procedure of forming the signal line, a procedure of forming the ground line, a procedure of electrically connecting the thin conductor and the signal line through the first through hole, and the procedure of electrically connecting the shield member and the ground line through the second through hole can be performed at the same time, so that it is possible to provide the electrical connection method of the printed circuit which can simplify the manufacturing still more.

In the electrical connection method of the printed circuit of one or more embodiments, in the forming of the through hole, a plurality of through holes may be formed. In the forming of the printed circuit, the plurality of through holes may be collectively filled with the conductive paste so as to electrically connect one circuit in the printed circuit to the thin conductor through the plurality of through holes when the printed circuit is formed on the base material.

According to one or more embodiments, a plurality of through holes are formed, and one circuit in the printed circuit is electrically connected to the thin conductor through the plurality of through holes, so that it is possible to stabilize the electrical connection and to improve flexibility.

According to one or more embodiments, an electrical connection structure of a printed circuit including a thin member in which a thin conductor is mounted, a base material which is placed on the thin member, and a printed circuit which is formed on the base material. A through hole is formed in the base material. The through hole passes through the base material and reaches the thin conductor of the thin member. The printed circuit is formed on the through hole in the base material. The through hole is filled with the same conductive member as the printed circuit.

According to one or more embodiments, the through hole which passes through the base material and reaches the thin conductor of the thin member is filled with the same conductive member as the printed circuit. Therefore, when the printed circuit is formed with the conductive member, the through hole can be filled with the conductive member, and thus it is possible to simplify the manufacturing procedure. Further, since the conductive adhesive is not applied on the printed circuit formed on the base material, the short circuit occurring between the printed circuit and the adjacent thin conductor due to flowing out of the conductive adhesive is also prevented. Therefore, it is possible to provide the electrical connection structure of the printed circuit which can be manufactured with a simpler procedure and reduce the possibility of a short circuit.

According to one or more embodiments, it is possible to provide an electrical connection method of a printed circuit and an electrical connection structure of the printed circuit which is simpler and is able to reduce a possibility of a short circuit.

BRIEF DESCRIPTION OF THE DRAWINGS

FIG. 3 is a process diagram illustrating an electrical connection method according to a comparative example.

FIG. 4A illustrates a first step. FIG. 4B illustrates a second step. FIG. 4C illustrates a third step.

FIG. 6A illustrates a first step. FIG. 6B illustrates a second step. FIG. 6C illustrates a third step.

DETAILED DESCRIPTION

Figure 1:
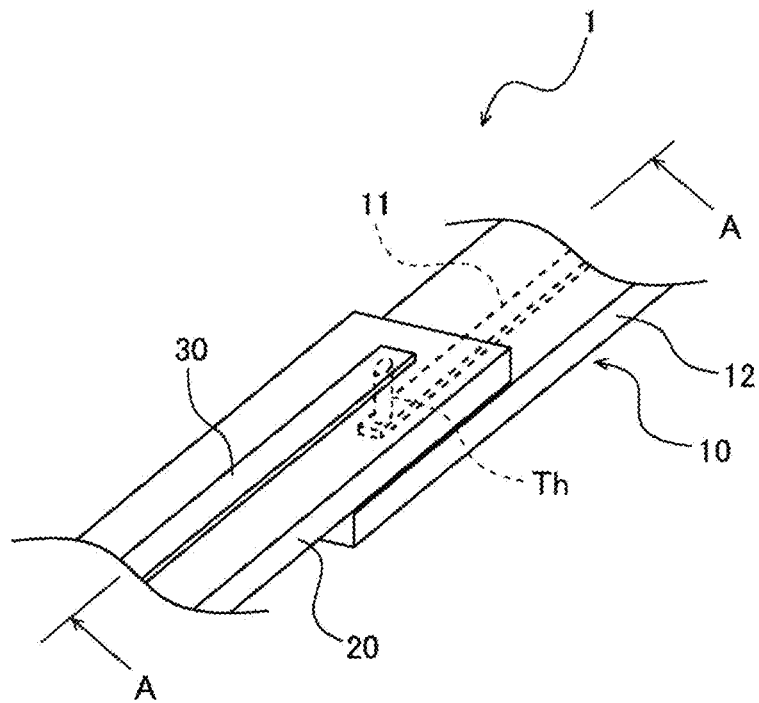
FIG. 1 is a perspective view illustrating an electrical connection structure of a printed circuit according to an embodiment.

Exemplary embodiments are described with reference to preferred embodiments. The invention is not limited to the embodiments below, and may be appropriately changed within a scope not departing from the spirit of the invention. In the embodiment described below, while some of the configurations are omitted in the drawings and the description, it is a matter of course that publicly-known or well-known techniques may be appropriately applied instead of the omitted technical details within a scope not causing discrepancies from the contents described below.

Figure 2:
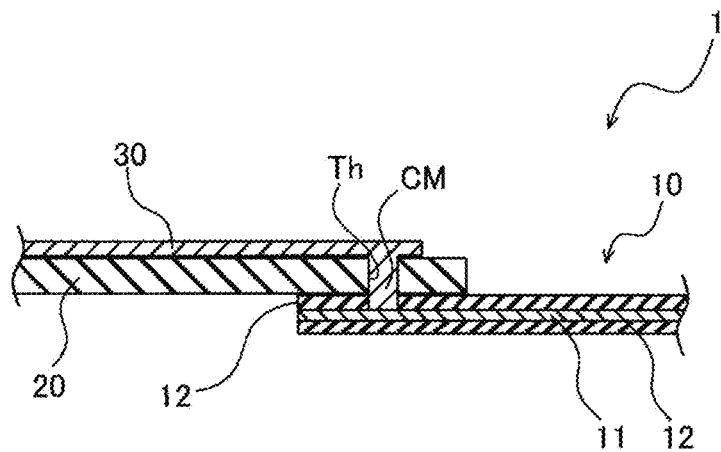
FIG. 2 is a cross-sectional view taken along line A-A illustrated in FIG. 1.

FIG. 1 is a perspective view illustrating an electrical connection structure of a printed circuit according to the embodiment, and FIG. 2 is a cross-sectional view taken along line A-A illustrated in FIG. 1. As illustrated in FIGS. 1 and 2, an electrical connection structure 1 of a printed circuit 30 includes an FFC (thin member) 10 which covers a thin flat conductor 11 by an insulating coated portion 12 to mount the conductor 11, a base material 20 which is made of an insulating film placed on the FFC 10, and the printed circuit 30 which is formed on the base material 20, and electrically connects the printed circuit 30 formed on the base material 20 to the conductor 11 in the FFC 10.

In the electrical connection structure 1, the base material 20 and the coated portion 12 of the FFC 10 are formed with a through hole Th which passes through the base material 20 and reaches the conductor 11. The printed circuit 30 is formed to pass by on the through hole Th, and the through hole Th is filled with the same conductive member CM as the printed circuit 30.

Herein, the electrical connection structure 1 can be manufactured with a simpler procedure and reduce a possibility of a short circuit. Next, an electrical connection method of the printed circuit 30 will be described and, before the description, an electrical connection method will be described as a comparative example.

FIG. 3 is a process diagram illustrating an electrical connection method according to the comparative example. As illustrated in FIG. 3, an FFC 110 and a base material 120 are prepared first. Next, the coated portion 112 of the FFC 110 is partially peeled off to expose a conductor 111 (S1). A printed circuit 130 is formed on the base material 120 by a screen printing method (S2). Next, a conductive adhesive 140 is interposed between the exposed conductor 111 and the printed circuit 130 (S3), and these components are overlapped, heated, and dried to be cured. Therefore, the printed circuit 130 and the conductor 111 are electrically connected (S4).

In the electrical connection method, there are necessary the procedures of the forming of the printed circuit, and the peeling, the applying of the conductive adhesive 140, and the curing. In particular, in a case where the printed circuit 130 is formed at a narrow pitch, the conductive adhesive 140 spreads out to the adjacent circuits, and thus the adjacent circuits come to be short-circuited if the anisotropic conductive adhesive is not used.

Figure 4A:
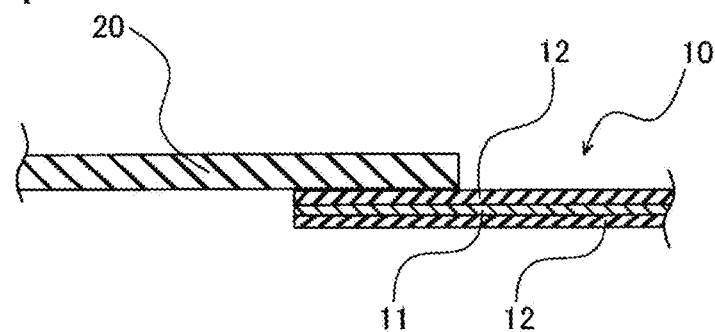
FIGS. 4A to 4C are cross-sectional views illustrating an electrical connection method of the printed circuit according to the embodiment.
Figure 4B:
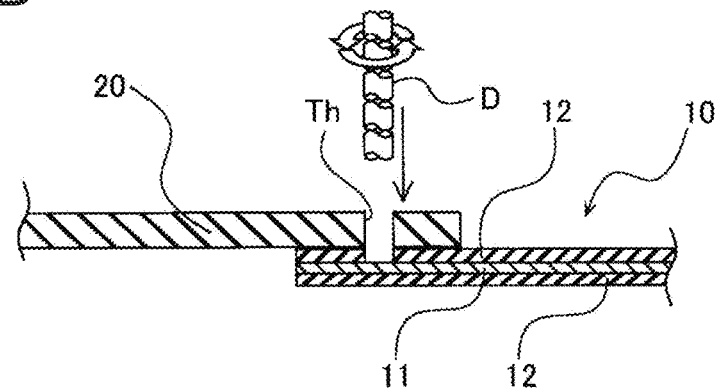
Figure 4C:
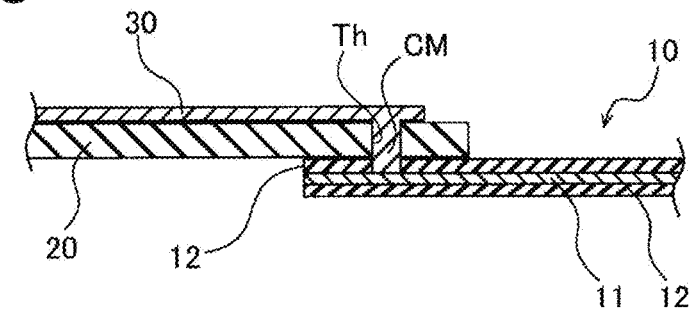

FIGS. 4A to 4C are cross-sectional views illustrating the electrical connection method of the printed circuit 30 according to the embodiment, in which FIG. 4A illustrates a first step, FIG. 4B illustrates a second step, and FIG. 4C illustrates a third step. In the electrical connection method according to the embodiment, the base material 20 and the FFC 10 are first overlapped as illustrated in FIG. 4A.

Next, as illustrated in FIG. 4B, the through hole Th is formed by a drill D from the base material 20 after the base material 20 and the FFC 10 are fixed using a tool. The through hole Th is formed while controlling a pushing amount of the drill D, and the coated portion 12 of the FFC 10 is also partially passed through while the base material 20 is passed through. Therefore, the through hole Th reaches the conductor 11 of the FFC 10.

Thereafter, as illustrated in FIG. 4C, the printed circuit 30 is formed on the base material 20 by the screen printing method using conductive paste (conductive ink, the conductive adhesive 140, etc.). Herein, the printed circuit 30 in the embodiment is formed on the through hole Th of the base material 20. Therefore, the through hole Th is filled with the conductive paste at the same time as the printed circuit 30 is formed.

In this way, the procedure of forming the printed circuit 30 is used to perform the electrical connection in the electrical connection method according to the embodiment.

Further, the conductive adhesive 140 is not applied on the printed circuit 30 formed on the base material 20, and thus the short circuit due to flowing out of the conductive adhesive 140 is also prevented.

In this way, according to the electrical connection method of the printed circuit 30 of the embodiment, the through hole Th is filled with the conductive paste when the printed circuit 30 is formed on the base material 20. Therefore, the electrical connection is performed using at least the procedure of forming the printed circuit 30, resulting in simplification of the manufacturing procedure. Further, the conductive adhesive 140 is not applied on the printed circuit 30 formed on the base material 20, and thus it is prevented the short circuit occurring between the adjacent conductor 10 due to flowing out of the conductive adhesive 140. Therefore, it is possible to provide the electrical connection method of the printed circuit 30 which is simpler and is able to reduce a possibility of a short circuit.

According to the electrical connection structure 1 of the printed circuit 30 of the embodiment, the through hole Th reaching the conductor 11 of the FFC 10 while passing through the base material 20 is filled with the same conductive member CM as the printed circuit 30. Therefore, when the printed circuit 30 is formed with the conductive member CM, the through hole Th can be filled with the conductive member CM, and thus it is possible to simplify the manufacturing procedure. Further, since the conductive adhesive is not necessarily applied on the printed circuit formed on the base material 20, the short circuit occurring between the printed circuit 30 and the adjacent conductor 10 due to flowing out of the conductive adhesive 140 is prevented. Therefore, it is possible to provide the electrical connection structure 1 of the printed circuit 30 which can be manufactured with a simpler procedure and reduce a possibility of a short circuit.

Next, a second embodiment of the invention will be described. The electrical connection method and the structure of the printed circuit 30 according to the second embodiment are similar to those of the first embodiment except some configurations and procedures. Hereinafter, the description will be given about differences from the first embodiment.

Figure 5:
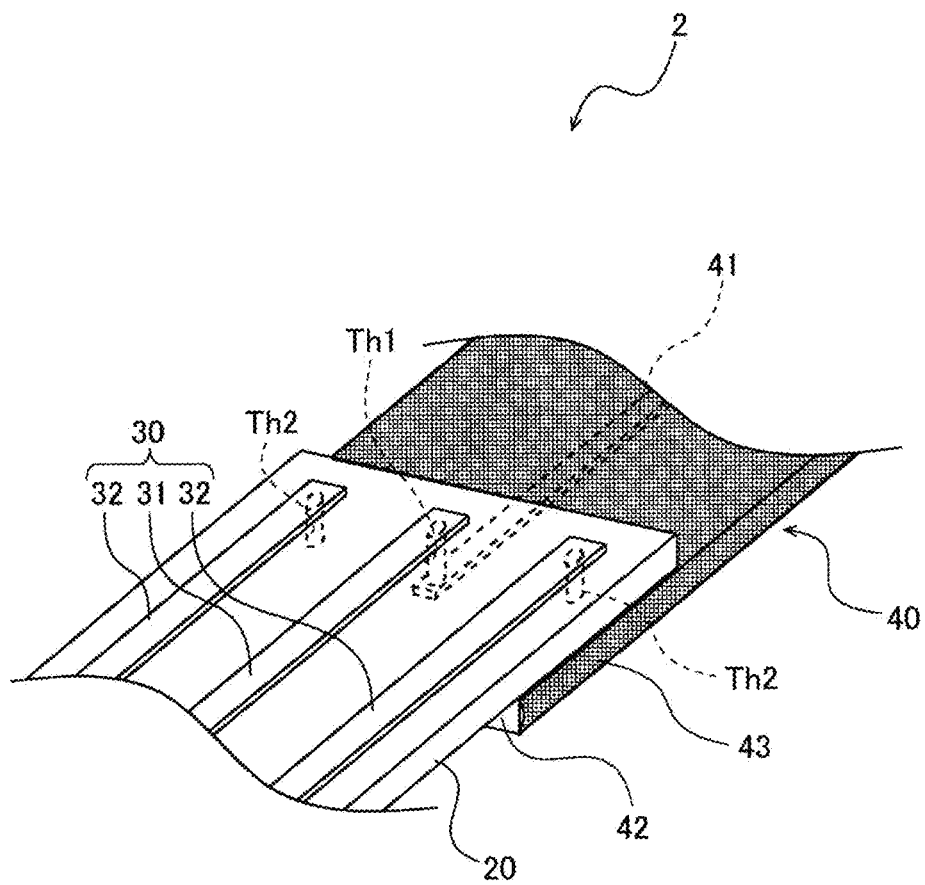
FIG. 5 is a perspective view illustrating an electrical connection structure of the printed circuit according to a second embodiment.

FIG. 5 is a perspective view illustrating an electrical connection structure of the printed circuit 30 according to the second embodiment. As illustrated in FIG. 5, an electrical connection structure 2 according to the second embodiment is provided with a flat shield cable 40 instead of the FFC 10. The flat shield cable 40 is configured such that a thin flat conductor (thin conductor) 41 is covered by the insulating coated portion 42 and mounted, and a shield member (thin conductor) 43 such as a metal braid is wound around the coated portion 42. Herein, the flat shield cable 40 according to the second embodiment is wound by the shield member 43 except one portion 44 (see FIG. 6A).

In the second embodiment, the base material 20 and the coated portion 42 of the flat shield cable 40 are formed with a first through hole Th1 reaching the conductor 41 such that the first through hole passes through the base material 20 to open the one portion 44 not covered by the shield member 43. Further, the base material 20 is formed with a second through hole Th2 reaching the shield member 43 such that the second through hole passes through the base material 20. In the second embodiment, the first through hole Th1 is formed by one, and the second through hole Th2 is formed by two, but the number is not particularly limited thereto.

In addition, in the second embodiment, the printed circuit 30 includes a signal line (first printed circuit) 31 and a ground line (second printed circuit) 32. The signal line 31 is printed to pass through the first through hole Th1 in the base material 20. The first through hole Th1 is filled with the same conductive member CM as the signal line 31 and the ground line 32. Similarly, the ground line 32 is printed to pass through the second through hole Th2 in the base material 20. The second through hole Th2 is also filled with the same conductive member CM as the signal line 31 and the ground line 32.

In the second embodiment, three circuits (one circuit for the signal line 31, and two circuits for the ground lines 32) are formed on the base material 20 in accordance with the number of the through holes Th1 and Th2, but the number is not particularly limited thereto.

Figure 6A:
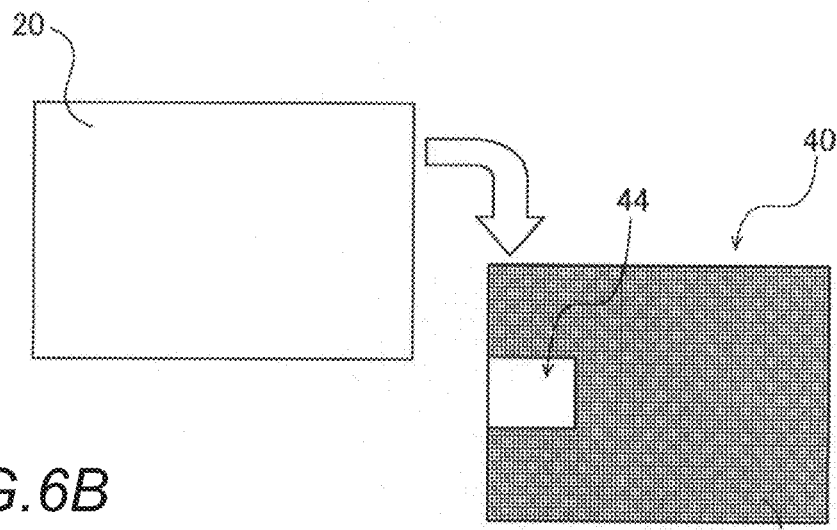
FIGS. 6A to 6C are cross-sectional views illustrating an electrical connection method of the printed circuit according to the second embodiment.
Figure 6B:
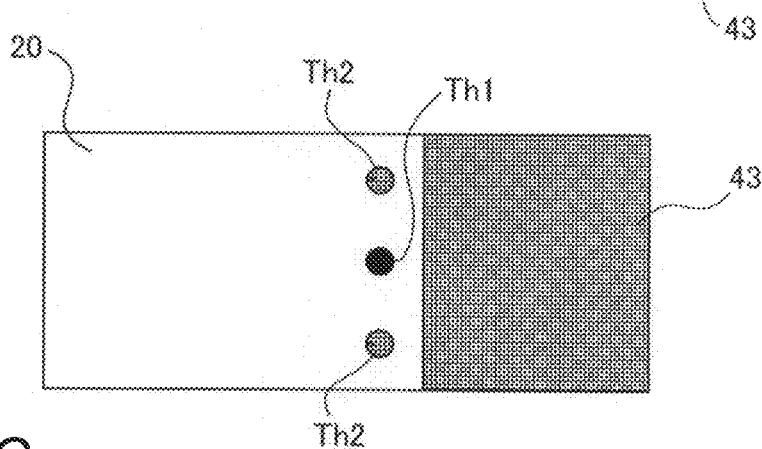
Figure 6C:
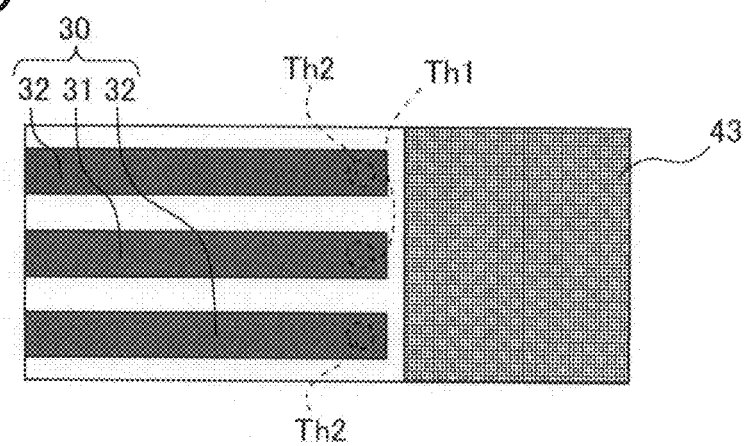

FIGS. 6A to 6C are cross-sectional views illustrating the electrical connection method of the printed circuit 30 according to the second embodiment, in which FIG. 6A illustrates a first step, FIG. 6B illustrates a second step, and FIG. 6C illustrates a third step. In the electrical connection method according to the second embodiment, the base material 20 is first overlapped with the flat shield cable 40 as illustrated in FIG. 6A. At this time, the base material 20 is overlapped such that the one portion 44 not covered by the shield member 43 is totally hidden by the base material 20.

Next, as illustrated in FIG. 6B, the first through hole Th1 is formed to pass through the base material 20 and to open the one portion 44 not covered by the shield member 43 so as to reach the conductor 41, and the second through hole Th2 is formed to pass through the base material 20 to reach the shield member 43. At this time, the first and second through holes Th1 and Th2 are formed using the drill D similarly to the first embodiment.

Thereafter, as illustrated in FIG. 6C, the printed circuit 30 is formed on the base material 20 by the screen printing method using the conductive paste (conductive ink or a conductive adhesive). At this time, the signal line 31 is formed to pass through the first through hole Th1. Therefore, the first through hole Th1 is filled with the conductive paste. The ground line 32 is formed to pass through the second through hole Th2. Therefore, the second through hole Th2 is filled with the conductive paste. Herein, the signal line 31 and the ground line 32 are formed on the base material 20 at the same time.

In this way, according to the electrical connection method and the structure 2 of the printed circuit 30 of the second embodiment, it is possible to be simpler and to reduce a possibility of a short circuit similarly to the first embodiment.

Further, according to the second embodiment, the first through hole Th1 reaching the conductor 41 is filled with the conductive paste when the signal line 31 is formed, and the second through hole Th2 which passes through the base material 20 and reaches the shield member 43 is filled with the conductive paste when the signal line 31 and the ground line 32 are formed at the same time. Therefore, the procedure of forming the signal line 31, the procedure of forming the ground line 32, the procedure of electrically connecting the conductor 11 and the signal line 31 through the first through hole Th1, and the procedure of electrically connecting the shield member 43 and the ground line 32 through the second through hole Th2 can be performed at the same time. Therefore, it is possible to provide the electrical connection method of the printed circuit 30 which can simplify the manufacturing still more.

Next, a third embodiment of the invention will be described. The electrical connection method and the structure of the printed circuit 30 according to the third embodiment are similar to those of the first embodiment except some configurations and procedures. Hereinafter, the description will be given about differences from the first embodiment.

Figure 7:
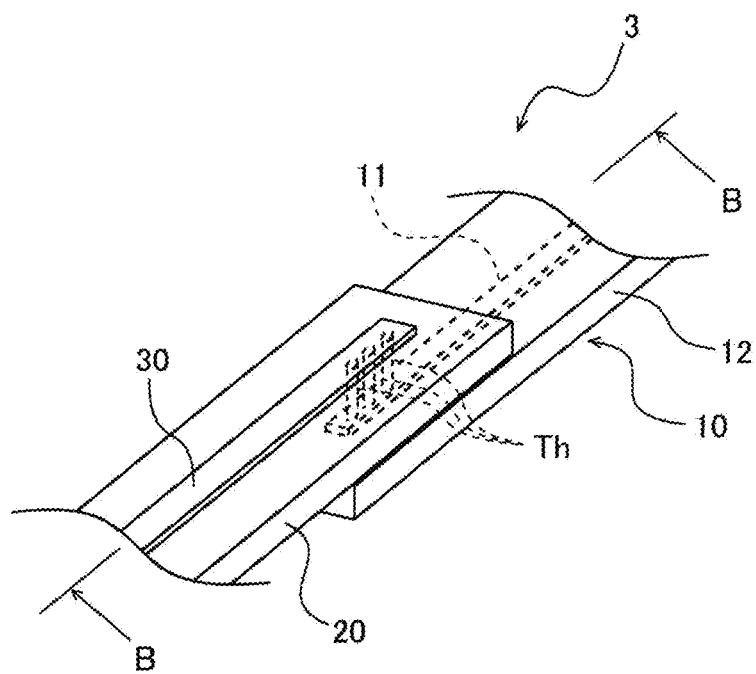
FIG. 7 is a perspective view illustrating an electrical connection structure of the printed circuit according to a third embodiment.
Figure 8:
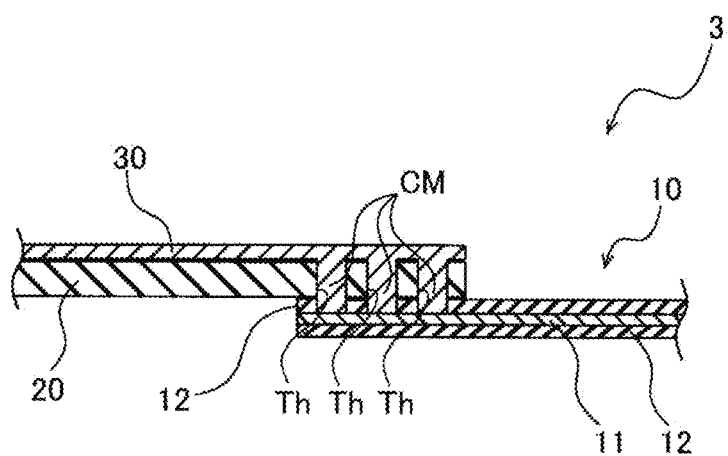
FIG. 8 is a cross-sectional view taken along line B-B illustrated in FIG. 7.

FIG. 7 is a perspective view illustrating an electrical connection structure of the printed circuit according to the third embodiment, and FIG. 8 is a cross-sectional view taken along line B-B illustrated in FIG. 7. As illustrated in FIGS. 7 and 8, a plurality (three in FIG. 7) of through holes Th are adjacently formed to pass through the base material 20 and parts of the coated portion 12 in an electrical connection structure 3 of the printed circuit 30 according to the third embodiment.

Further, in the third embodiment, the printed circuit (particularly one circuit of the printed circuit 30) formed on the base material 20 is printed to pass through the plurality of through holes Th, and the plurality of through holes Th are filled with the same conductive member CM as the printed circuit 30 (particularly one circuit of the printed circuit 30).

The electrical connection method of the printed circuit 30 according to the third embodiment is performed as follows. In other words, first, the base material 20 and the FFC 10 are overlapped, the plurality of through holes Th are formed by the drill D from the base material 20 to reach the conductor 11.

Thereafter, the printed circuit 30 is formed on the base material 20 by the screen printing method using the conductive paste. At this time, the printed circuit 30 is formed to pass through the plurality of through holes Th, and the plurality of through holes Th are collectively filled with the conductive paste. Therefore, one circuit in the printed circuit 30 is electrically connected to the conductor 11 through the plurality of through holes Th.

In this way, according to the electrical connection method and the structure 3 of the printed circuit 30 of the third embodiment, it is possible to be simpler and to reduce a possibility of a short circuit similarly to the first embodiment.

Further, according to the third embodiment, the plurality of through holes Th are formed, one circuit in the printed circuit 30 is electrically connected to the conductor 11 through the plurality of through holes Th. Therefore, it is possible to stabilize the electrical connection, and to improve flexibility.

Hitherto, the description has been given on the basis of the embodiments, but the invention is not limited to the above embodiments. Changes may be made within a scope not departing from the spirit of the invention, and the techniques described in the respective embodiments may be combined. Further, other techniques (including well-known and publicly-known techniques) may be combined.

For example, the FFC 10 and the flat shield cable 40 are exemplified as a thin member in the above embodiments, but the invention is not limited thereto, and the thin member may be an FPC. Further, the base material 20 and the thin member are assumed as a flexible member, but the invention is not limited thereto, and the base material and the thin member may be configured such that either one has flexibility or the other is a highly-rigid member having no flexibility.

DESCRIPTION OF REFERENCE NUMERALS AND SIGNS 1, 2, 3: electrical connection structure
10: FFC (thin material)
11: thin flat conductor (thin conductor)
12: insulating coated portion
20: base material
30: printed circuit
31: signal line (first printed circuit)
32: ground line (second printed circuit)
40: flat shield cable (thin material)
41: thin flat conductor (thin conductor)
42: insulating coated portion
43: shield member (thin conductor)
44: one portion
CM: conductive member
D: drill
Th: through hole
Th1: first through hole
Tj2: second through hole

What is claimed is:

1. An electrical connection method of a printed circuit, comprising:
   overlapping a base material and a thin member in which a thin conductor is mounted;
   forming a through hole which passes through the base material overlapped with the thin member, and reaches the thin conductor of the thin member; and
   forming the printed circuit on the base material by a screen printing method using conductive paste,
   wherein the through hole is filled with the conductive paste in the forming of the printed circuit,
   wherein the thin member is a flat shield cable covered with a shield member except one portion of the thin member,
   wherein in the forming of the through hole, a first through hole is formed to pass through the base material overlapped in the overlapping and to open the one portion of the thin member so as to reach the thin conductor, and a second through hole is formed to pass through the base material overlapped in the overlapping to reach the shield member, and
   wherein in the forming of the printed circuit, the first through hole is filled with the conductive paste when a signal line is formed as a first printed circuit on the base material, and the second through hole is filled with the conductive paste when a ground line is formed as a second printed circuit on the base material at the same time as the signal line is formed.

2. The electrical connection method of the printed circuit according to claim 1,
   wherein in the forming of the through hole, a plurality of through holes are formed, and
   wherein in the forming of the printed circuit, the plurality of through holes are filled with the conductive paste so as to electrically connect one circuit in the printed circuit to the thin conductor through the plurality of through holes when the printed circuit is formed on the base material.

* * * * *